(12) United States Patent
Miwa et al.

(10) Patent No.: US 12,106,930 B2
(45) Date of Patent: Oct. 1, 2024

(54) CHARGED PARTICLE BEAM DEVICE

(71) Applicant: Hitachi High-Tech Corporation, Tokyo (JP)

(72) Inventors: Takafumi Miwa, Tokyo (JP); Go Miya, Tokyo (JP); Kazuma Tanii, Tokyo (JP); Seiichiro Kanno, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 343 days.

(21) Appl. No.: 17/778,599

(22) PCT Filed: Dec. 23, 2019

(86) PCT No.: PCT/JP2019/050279
§ 371 (c)(1),
(2) Date: May 20, 2022

(87) PCT Pub. No.: WO2021/130805
PCT Pub. Date: Jul. 1, 2021

(65) Prior Publication Data
US 2023/0005700 A1    Jan. 5, 2023

(51) Int. Cl.
*H01J 37/12* (2006.01)
*H01J 37/28* (2006.01)

(52) U.S. Cl.
CPC ............... *H01J 37/12* (2013.01); *H01J 37/28* (2013.01); *H01J 2237/022* (2013.01)

(58) Field of Classification Search
CPC .. H01J 37/02; H01J 37/12; H01J 37/26; H01J 37/22; H01J 37/28; H01J 37/226;
(Continued)

(56) References Cited

U.S. PATENT DOCUMENTS

| 2008/0308471 A1 | 12/2008 | Huber et al. |
| 2009/0166565 A1* | 7/2009 | Alcott ............... H01J 37/05 250/492.21 |

(Continued)

FOREIGN PATENT DOCUMENTS

| CN | 107735850 A | 2/2018 |
| JP | 2014-82140 A | 5/2014 |
| TW | 201129853 A1 | 9/2011 |

OTHER PUBLICATIONS

International Search Report (PCT/ISA/210) issued in PCT Application No. PCT/JP2019/050279 dated Mar. 3, 2020 with English translation (four (4) pages).

(Continued)

*Primary Examiner* — David E Smith
*Assistant Examiner* — Hsien C Tsai
(74) *Attorney, Agent, or Firm* — Crowell & Moring LLP (57) ABSTRACT

Provided is a charged particle beam device capable of reducing scattering of a foreign substance collected by a foreign substance collecting unit. The charged particle beam device includes: a sample chamber in which a sample is to be disposed; and a charged particle beam source configured to irradiate the sample with a charged particle beam. The charged particle beam device further includes: a foreign substance attachment/detachment unit from or to which a foreign substance is to detach or attach; and a foreign substance collecting unit provided in the sample chamber and configured to collect a foreign substance dropped from the foreign substance attachment/detachment unit. An opening through which the foreign substance passes is provided in an upper end portion of the foreign substance collecting unit. An area of the opening is smaller than a horizontal cross-sectional area of an internal space of the foreign substance collecting unit.

15 Claims, 9 Drawing Sheets

(58) Field of Classification Search
CPC ...... H01J 37/244; H01J 37/20; H01J 2237/14; H01J 2237/18; H01J 2237/022; H01J 2237/221; H01J 2237/24585; H01J 2237/028
See application file for complete search history.

(56) References Cited

U.S. PATENT DOCUMENTS

2015/0279609 A1* 10/2015 Tanii ................. H01J 37/28
250/398
2018/0226218 A1    8/2018 Hwang

OTHER PUBLICATIONS

Japanese-language Written Opinion (PCT/ISA/237) issued in PCT/JP2019/050279 dated Mar. 3, 2020 (four (4) pages).
Taiwanese-language Office Action issued in Taiwanese Application No. 109145301 dated Sep. 30, 2021 with partial English translation (five (5) pages).

* cited by examiner

CHARGED PARTICLE BEAM DEVICE

TECHNICAL FIELD

The present invention relates to a charged particle beam device, and particularly relates to a technique for collecting foreign substances generated in a manufacturing process of a semiconductor device.

BACKGROUND ART

A charged particle beam device such as electron microscope and ion microscope is used for observing various samples with fine structures, and is particularly used for dimension measurement and defect inspection of a pattern formed on a semiconductor wafer in a manufacturing process of a semiconductor device. In order to maintain a yield of semiconductor devices, it is necessary to collect foreign substances generated in the manufacturing process.

PTL 1 discloses that a foreign substance collecting unit having a mesh electrode therein is positioned below an objective lens attached with a foreign substance, and a potential difference is generated between the foreign substance collecting unit and the objective lens, whereby the foreign substance attached to the objective lens is dropped and collected by the foreign substance collecting unit.

CITATION LIST

Patent Literature

PTL 1: JP-A-2014-82140

SUMMARY OF INVENTION

Technical Problem

PTL 1, however, has not considered about scattering from the foreign substance collecting unit of the foreign substance collected by the foreign substance collecting unit. That is, when the foreign substance is dropped to a foreign substance collecting unit in a container shape, the foreign substance may be scattered when colliding with an inner wall surface of the foreign substance collecting unit, and the scattered foreign substance lowers the yield of the semiconductor device.

Solution to Problem

Accordingly, an object of the invention is to provide a charged particle beam device capable of reducing scattering of a collected foreign substance.

Advantageous Effect

In order to achieve the above object, the invention relates to a charged particle beam device, including: a sample chamber in which a sample is to be disposed; and a charged particle beam source configured to irradiate the sample with a charged particle beam. The charged particle beam device further includes: a foreign substance attachment/detachment unit from or to which a foreign substance is to detach or attach; and a foreign substance collecting unit provided in the sample chamber and configured to collect a foreign substance dropped from the foreign substance attachment/detachment unit. An opening through which the foreign substance passes is provided in an upper end portion of the foreign substance collecting unit. An area of the opening is smaller than a horizontal cross-sectional area of an internal space of the foreign substance collecting unit.

The invention relates to a charged particle beam device including: a sample chamber in which a sample is to be disposed; and a charged particle beam source configured to irradiate the sample with a charged particle beam. The charged particle beam device further includes: a foreign substance attachment/detachment unit from or to which a foreign substance is to detach or attach; and a foreign substance collecting unit provided in the sample chamber and configured to collect a foreign substance dropped from the foreign substance attachment/detachment unit. The bottom surface of the foreign substance collecting unit has an inclined surface.

The invention relates to a charged particle beam device including: a sample chamber in which a sample is to be disposed; and a charged particle beam source configured to irradiate the sample with a charged particle beam. The charged particle beam device further includes: a foreign substance attachment/detachment unit from or to which a foreign substance is to detach or attach; and a foreign substance collecting unit provided in the sample chamber and configured to collect a foreign substance dropped from the foreign substance attachment/detachment unit. At least a part of an inner wall surface of the foreign substance collecting unit is a mirror surface or a surface of a material different from that of the foreign substance collecting unit.

Accordingly, the invention provides a charged particle beam device capable of reducing scattering of a collected foreign substance.

DESCRIPTION OF EMBODIMENTS

Hereinafter, embodiments of a charged particle beam device according to the invention will be described with reference to the accompanying drawings. The charged particle beam device is an apparatus for observing and processing a sample by irradiating the sample with a charged particle beam, and include various apparatuses such as scanning electron microscope, scanning ion microscope, and scanning transmission electron microscope. Hereinafter, as an example of the charged particle beam device, a scanning electron microscope for observing a sample using an electron beam, which is one of the charged particle beams, will be described.

First Embodiment

Figure 1:
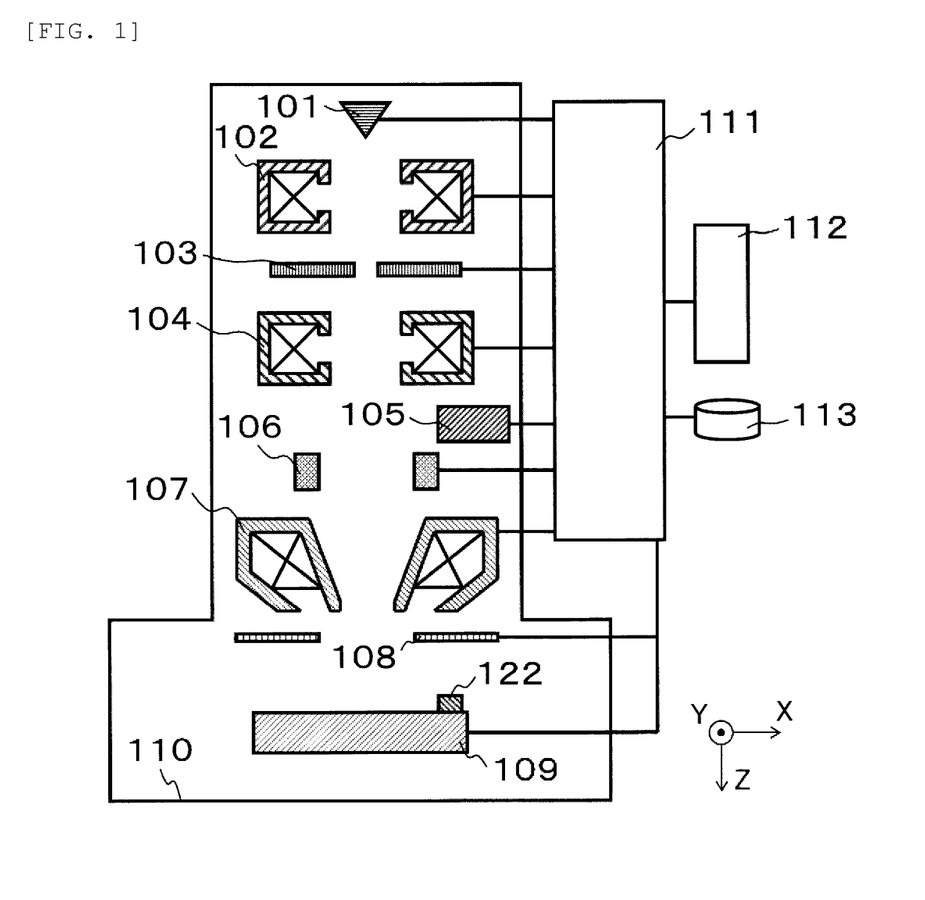
FIG. 1 is an overall configuration diagram of a scanning electron microscope which is an example of a charged particle beam device.

An overall configuration of a scanning electron microscope according to the present embodiment will be described with reference to FIG. 1. In FIG. 1, a vertical direction is defined as a Z direction, and horizontal directions are defined as an X direction and a Y direction.

In a housing 110 of the scanning electron microscope, an electron gun 101, a first condenser lens 102, an aperture 103, a second condenser lens 104, a detector 105, a scanning deflector 106, an objective lens 107, a shield electrode 108, a sample stage 109 and a foreign substance collecting unit 122 are installed. A sample for observation, inspection, and measurement is held on the sample stage 109. An electron beam emitted from the electron gun 101 passes through the first condenser lens 102, the aperture 103, the second condenser lens 104, the scanning deflectors 106, the objective lens 107, and the shield electrode 108, and is then deflected, focused, and used for irradiating a measurement position of the sample on the sample stage 109.

The housing 110 includes a sample chamber in which the sample stage 109 is installed, and the sample chamber is exhausted by a vacuum pump which is not shown. Operations of the electron gun 101, the first condenser lens 102, the aperture 103, the second condenser lens 104, the scanning deflectors 106, the objective lens 107, the shield electrode 108, and the sample stage 109 are controlled by a control unit 111.

Charged particles such as secondary electrons and/or reflected electrons, which are emitted from the sample by the irradiation with the electron beam, are detected by the detector 105. The detector 105 outputs a detection signal of the charged particles to the control unit 111. The control unit 111 forms an image of the sample based on the detection signal, and displays the image on a display unit provided in an input/output unit 112, or stores the image in a storage unit 113. The display unit may be arranged separately from the input/output unit 112. The formed image is used for a measurement such as a dimension measurement and a defect inspection of the sample.

The foreign substance collecting unit 122 is a container that collects a foreign substance that hinders observation of the sample, and is provided in the sample chamber, for example, on the sample stage 109. The foreign substance present in the sample chamber is once attached to a foreign substance attachment/detachment unit such as the objective lens 107 before observation of the sample, and then is dropped and collected by the foreign substance collecting unit 122 moved below the foreign substance attachment/detachment unit. The foreign substance attachment/detachment unit is a member from or to which a foreign substance is detached or attached by an electric field or a magnetic field, and is not limited to the objective lens 107.

Meanwhile, the foreign substance detached from the foreign substance attachment/detachment unit and dropped to the foreign substance collecting unit 122 may collide with the inner wall surface, i.e., a bottom surface or a side surface, of the foreign substance collecting unit 122 and scatter from the foreign substance collecting unit 122, and the scattered foreign substance hinders sample observation. Therefore, in order to reduce scattering of the foreign substance collected by the foreign substance collecting unit 122, an area of an opening provided in the upper end portion of the foreign substance collecting unit 122 and through which the foreign substance passes is made smaller than a horizontal cross-sectional area of an internal space of the foreign substance collecting unit 122.

Figure 2:
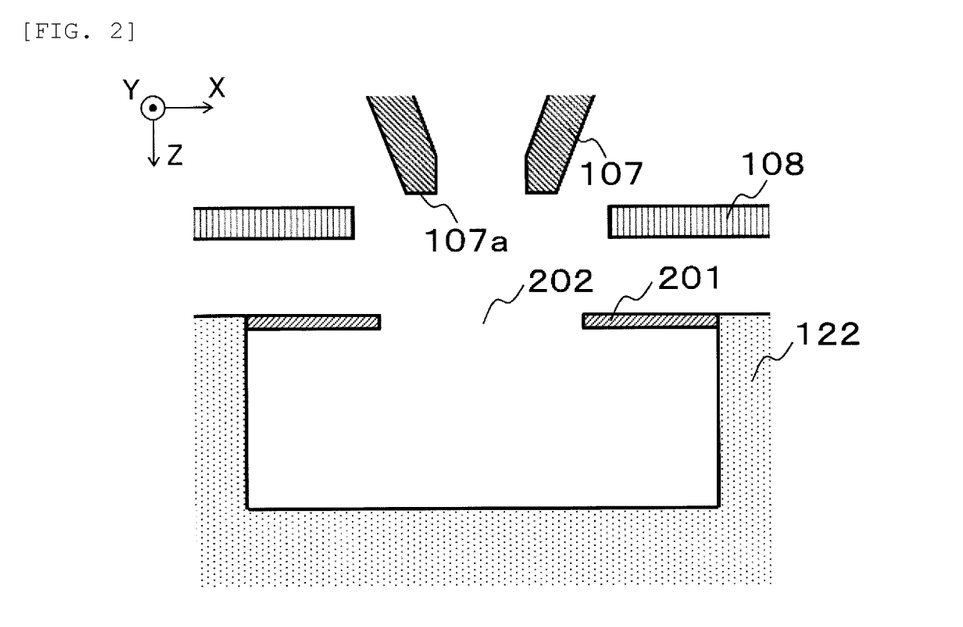
FIG. 2 is a diagram showing a foreign substance collecting unit according to a first embodiment.

The foreign substance collecting unit 122 according to the present embodiment will be described with reference to FIG. 2. FIG. 2 is a cross-sectional view of the foreign substance collecting unit 122 disposed below the objective lens 107 that functions as a foreign substance attachment/detachment unit. A lid 201 is attached to an upper end portion of the foreign substance collecting unit 122 of the present embodiment. The lid 201 is provided with a hole 202 through which a foreign substance passes at the center thereof. The area of the hole 202 is smaller than the horizontal cross-sectional area of the internal space of the foreign substance collecting unit 122. A bottom surface of the foreign substance collecting unit 122 may be configured with the sample stage 109 or the sample chamber.

With such a configuration, the foreign substance that is dropped from the objective lens 107, rebounds from the bottom surface of the foreign substance collecting unit 122, and is about to scatter to the outside of the foreign substance collecting unit 122 collides with a lower surface of the lid 201. The foreign substance that has collided with the lower surface of the lid 201 is decelerated while repeatedly colliding with the side surface and the bottom surface of the foreign substance collecting unit 122 and the lower surface of the lid 201, and remains in the internal space of the foreign substance collecting unit 122.

It is preferable that the foreign substance collecting unit 122 including the lid 201 and the foreign substance attachment/detachment unit are conductive members, and different voltages can be applied to the foreign substance collecting unit 122 and the foreign substance attachment/detachment unit. According to such a configuration, since an electric field can be formed between the foreign substance collecting unit 122 and the foreign substance attachment/detachment unit, it is easy to detach the foreign substance from the foreign substance attachment/detachment unit and to collect the foreign substance by the foreign substance collecting unit 122. In addition, it is preferable that the foreign substance collecting unit 122 including the lid 201 has a symmetrical shape with respect to a vertical axis, and for example, it is more preferable that the lid 201 has an annular shape and the foreign substance collecting unit 122 has a cylindrical shape having a bottom surface. When the foreign substance collecting unit 122 has a symmetrical shape with respect to the vertical axis, an electric field formed between the foreign substance collecting unit 122 and the foreign substance attachment/detachment unit becomes uniform, and a collection rate of the foreign substance by the foreign substance collecting unit 122 can be made uniform.

In addition, when the objective lens 107 functions as a foreign substance attachment/detachment unit, since a larger amount of foreign substance adheres to a lower end portion 107a of the objective lens 107, it is preferable that the size of the hole 202 is larger than that of the lower end portion 107a of the objective lens 107. By making the hole 202 larger than the lower end portion 107a of the objective lens 107, most of the foreign substance dropped from the objective lens 107 is collected by the foreign substance collecting unit 122.

Figure 3:
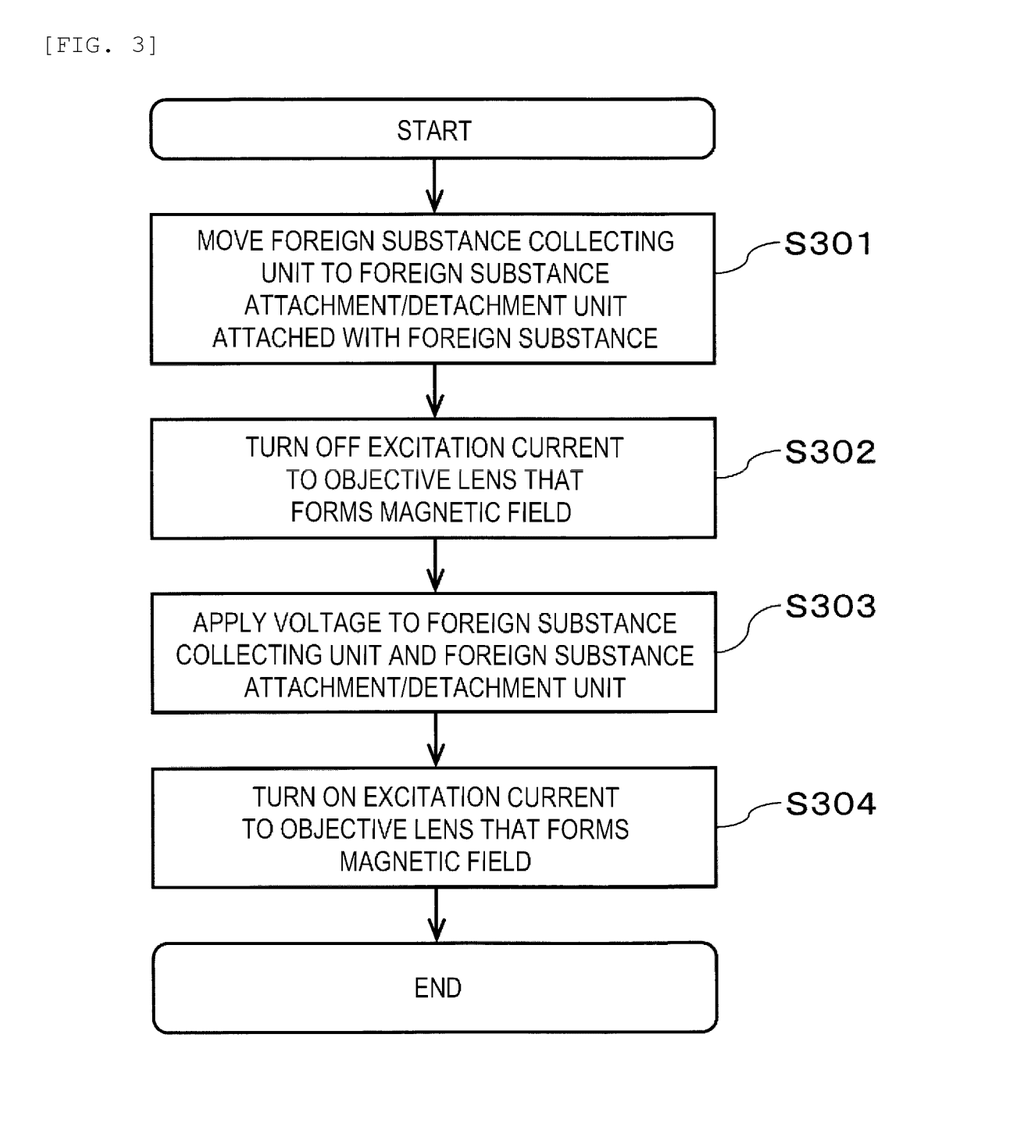
FIG. 3 is a diagram showing an example of a processing flow according to the first embodiment.

An example of a processing flow of the present embodiment according to the configuration described with FIGS. 1 and 2 will be described with FIG. 3.

(S301)

The control unit 111 moves the foreign substance collecting unit 122 below a foreign substance attachment/detachment unit attached with a foreign substance, for example, the objective lens 107. When the foreign substance collecting unit 122 is provided on the sample stage 109, the control unit 111 controls the movement of the sample stage 109 to move the foreign substance collecting unit 122 below the foreign substance attachment/detachment unit.

(S302)

The control unit 111 sets an excitation current to the objective lens 107 that forms the magnetic field to 0, so as to cause the magnetic field formed in the sample chamber to disappear. The foreign substance attached to the foreign substance attachment/detachment unit such as the objective lens 107 by the magnetic field loses an adhesive force due to disappearance of the magnetic field.

(S303)

The control unit 111 applies a voltage to each of the foreign substance collecting unit 122 and the foreign substance attachment/detachment unit. The voltage applied to the foreign substance collecting unit 122 and the foreign substance attachment/detachment unit is different from the voltage applied when the sample is observed, and an electric field having an intensity that allows the foreign substance attached to the foreign substance attachment/detachment unit to be detached is formed between the foreign substance collecting unit 122 and the foreign substance attachment/detachment unit. That is, by the electric field formed between the foreign substance collecting unit 122 and the foreign substance attachment/detachment unit applied with the voltage, the foreign substance is detached from the foreign substance attachment/detachment unit and is dropped into the hole 202 provided in the center of the lid 201 attached to the upper end portion of the foreign substance collecting unit 122. The dropped foreign substance is decelerated by repeatedly colliding with the inner wall surface of the foreign substance collecting unit 122, and is collected by the foreign substance collecting unit 122.

(S304)

The control unit 111 sets the excitation current to the objective lens 107 that forms the magnetic field to a normal value, and returns the magnetic field formed in the sample chamber to an original value.

According to the flow of processing described above, the foreign substance attached to the foreign substance attachment/detachment unit, for example, the objective lens 107 is collected by the foreign substance collecting unit 122. In the process of collecting the foreign substance by the foreign substance collecting unit 122, the foreign substance that has been dropped into the foreign substance collecting unit 122 and has repeatedly collided with the bottom surface and the side surface of the foreign substance collecting unit 122 and the lower surface of the lid 201 remains in the foreign substance collecting unit 122 without being scattered. That is, according to the present embodiment, it is possible to provide a charged particle beam device capable of reducing scattering of a collected foreign substance.

Second Embodiment

The first embodiment has described the foreign substance collecting unit 122 whose upper end portion is attached with the lid 201 provided with the hole 202 through which the foreign substance passes at the center. In the present embodiment, a side surface of the foreign substance collecting unit 122 is inclined toward a bottom surface side. Matters described in the first embodiment and not described in the present embodiment can also be applied to the present embodiment unless under special circumstances.

Figure 4:
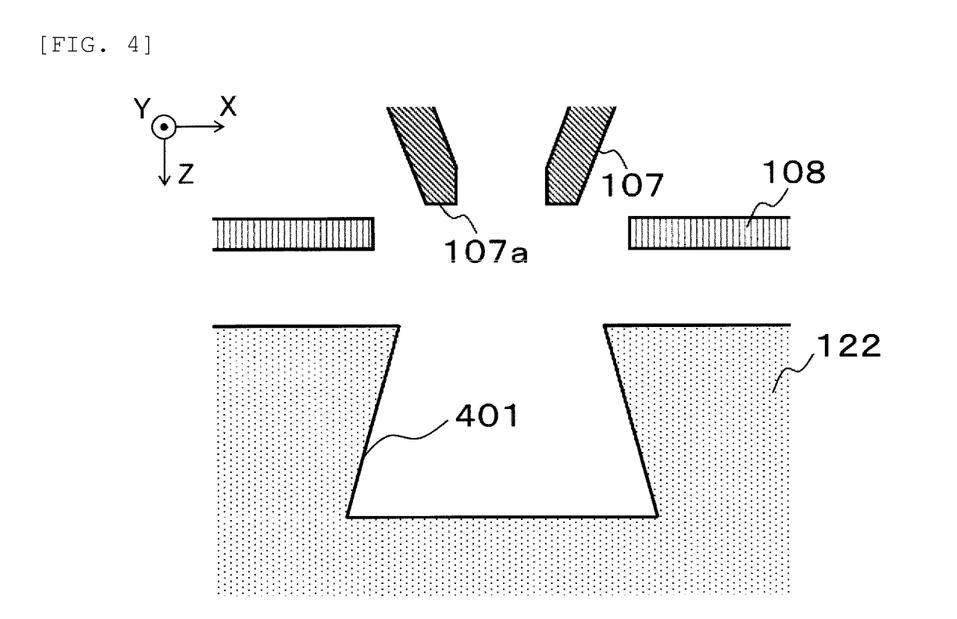
FIG. 4 is a diagram showing a foreign substance collecting unit according to a second embodiment.

The foreign substance collecting unit 122 according to the present embodiment will be described with reference to FIG. 4. FIG. 4 is a cross-sectional view of the foreign substance collecting unit 122 disposed below the objective lens 107 that functions as a foreign substance attachment/detachment unit. As shown in FIG. 4, the side surface 401 of the foreign substance collecting unit 122 of the present embodiment is inclined toward the bottom surface side. Since the side surface 401 is inclined toward the bottom surface side, the opening of the upper end portion of the foreign substance collecting unit 122 has an area smaller than the horizontal cross-sectional area of the internal space. In the case where the foreign substance attachment/detachment unit is the objective lens 107, the opening of the upper end portion of the foreign substance collecting unit 122 is preferably larger than the outer diameter of the lower end portion 107a of the objective lens 107, which is attached with more foreign substance. The lid 201 having the hole 202 at the center may not be attached to the upper end portion of the foreign substance collecting unit 122 of the present embodiment.

In the foreign substance collecting unit 122 of the present embodiment, after the foreign substance which is detached from the foreign substance attachment/detachment unit and dropped is rebounded by the bottom surface of the foreign substance collecting unit 122, the foreign substance repeatedly collides with the side surface 401 or the bottom surface inclined toward the bottom surface side. Since the foreign substance repeatedly colliding with the inner wall surface of the foreign substance collecting unit 122 is eventually decelerated, the foreign substance remains in the internal space of the foreign substance collecting unit 122 without being scattered. That is, also in the present embodiment, similarly to the first embodiment, it is possible to provide a charged particle beam device capable of reducing scattering of a collected foreign substance.

Third Embodiment

The first embodiment has described the foreign substance collecting unit 122 whose upper end portion is attached with the lid 201 provided with the hole 202 through which the foreign substance passes at the center. The present embodiment will describe providing a mesh electrode at the upper end portion of the foreign substance collecting unit 122. Matters described in the first embodiment and not described in the present embodiment can also be applied to the present embodiment unless under special circumstances.

Figure 5A:
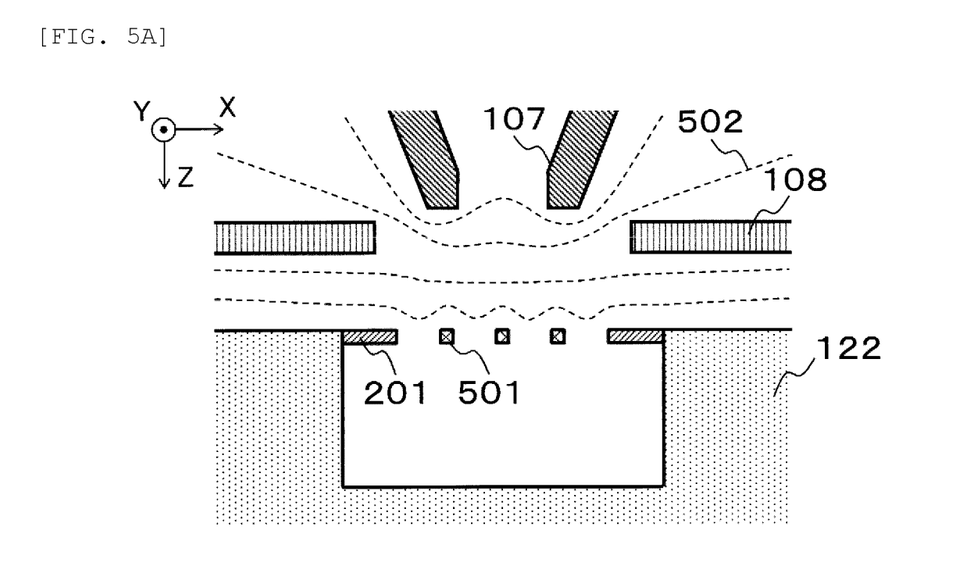
FIG. 5A is a diagram showing a foreign substance collecting unit according to a third embodiment together with equipotential surfaces.

The foreign substance collecting unit 122 according to the present embodiment will be described with reference to FIG. 5A. FIG. 5A is a cross-sectional view of the foreign substance collecting unit 122 of the present embodiment disposed below the objective lens 107. As shown in FIG. 5A, in the foreign substance collecting unit 122 of the present embodiment, a mesh electrode 501 is provided in the hole 202 of the lid 201. A gap of the mesh electrode 501 has such a size that a foreign substance can pass therethrough. That is, the gap of the mesh electrode 501 is the opening at the upper end portion of the foreign substance collecting unit 122, and an area of the gap of the mesh electrode 501 is smaller than the horizontal cross-sectional area of the internal space of the foreign substance collecting unit 122.

With such a configuration, the foreign substance that is dropped from the objective lens 107, passes through the gap of the mesh electrode 501, and bounces back at the bottom surface of the foreign substance collecting unit 122 collides with the lid 201 and the lower surface of the mesh electrode 501. The foreign substance that has collided with the lower surface of the lid 201 or the mesh electrode 501 is decelerated while repeatedly colliding with the side surface and the bottom surface of the foreign substance collecting unit 122 and the lower surface of the lid 201, and remains in the internal space of the foreign substance collecting unit 122.

Figure 5B:
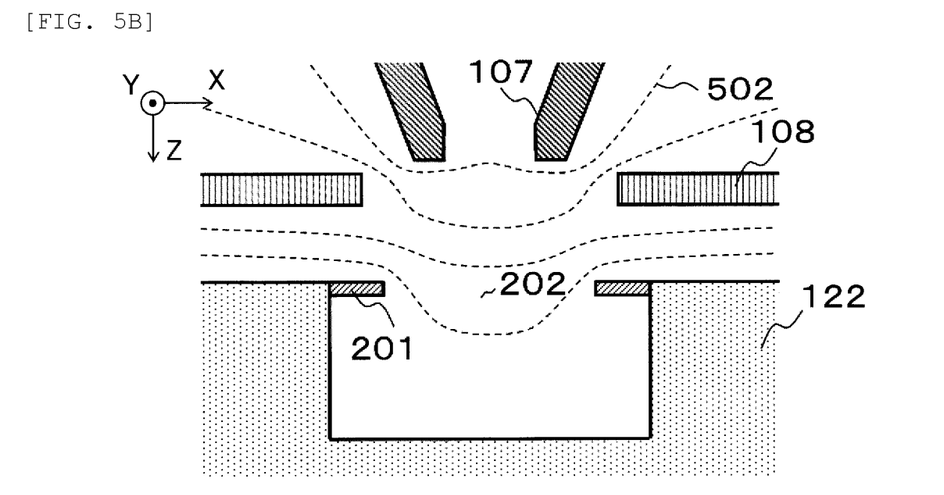
FIG. 5B is a diagram showing equipotential surfaces of the foreign substance collecting unit according to the first embodiment.

In addition, when a voltage is applied to the foreign substance collecting unit 122 and the foreign substance attachment/detachment unit such as the objective lens 107 of the present embodiment, the intensity of the electric field formed between the foreign substance collecting unit 122 and the foreign substance attachment/detachment unit can be increased as compared with the foreign substance collecting unit 122 of the first embodiment shown in FIG. 5B. In FIGS. 5A and 5B, equipotential surfaces 502 when a voltage is applied to the foreign substance collecting unit 122, the objective lens 107, and the shield electrode 108 are indicated by dotted lines. In FIG. 5A, the distance between the equipotential surfaces 502 is narrower than that in FIG. 5B, and the intensity of the electric field is higher than that in FIG. 5B. That is, the foreign substance collecting unit 122 of the present embodiment is easier to desorb the foreign substance from the foreign substance attachment/detachment unit and easier to collect the foreign substance by the foreign substance collecting unit 122 than in the first embodiment.

Figure 6A:
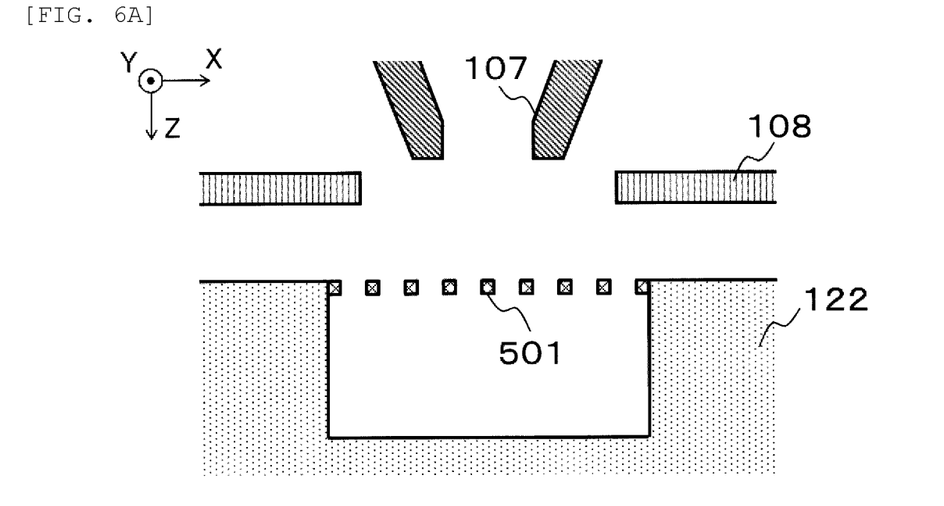
FIG. 6A is a diagram showing a first modification of the foreign substance collecting unit according to the third embodiment.
Figure 6B:
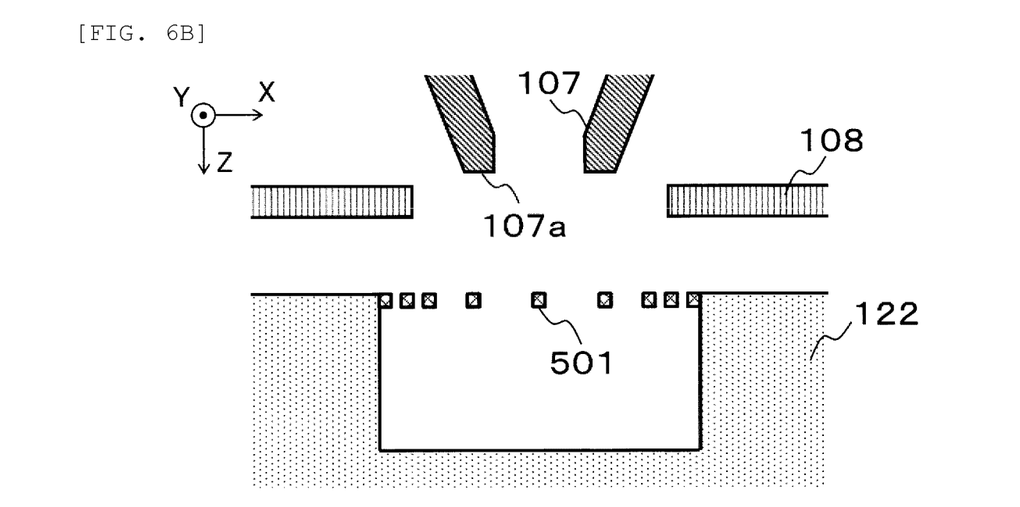
FIG. 6B is a diagram showing a second modification of the foreign substance collecting unit according to the third embodiment.

A modification of the foreign substance collecting unit 122 according to the present embodiment will be described with reference to FIG. 6. FIG. 6A is a cross-sectional view of a foreign substance collecting unit 122 of a first modification disposed below the objective lens 107, and FIG. 6B is a cross-sectional view of a foreign substance collecting unit 122 of a second modification disposed below the objective lens 107. In FIGS. 6A and 6B, the lid 201 having the hole 202 in the center is not attached to the upper end portion of the foreign substance collecting unit 122, and only the mesh electrode 501 having a gap through which the foreign substance can pass is provided. That is, the gap of the mesh electrode 501 is the opening at the upper end portion of the foreign substance collecting unit 122, and a total area of gaps of the mesh electrode 501 is smaller than the horizontal cross-sectional area of the internal space of the foreign substance collecting unit 122.

The mesh electrode 501 in FIG. 6A has an equal pitch, and the mesh electrode 501 in FIG. 6B has an unequal pitch. The gap of the mesh electrode 501 is larger in a central portion than in a peripheral portion of the foreign substance collecting unit 122. By making the gap in a central portion of the foreign substance collecting unit 122 larger than the gap in the peripheral portion, the foreign substances dropped to the central portion of the foreign substance collecting unit 122 easily passes through the gap of the mesh electrode 501, and the foreign substance rebounding toward the peripheral portion at the bottom surface of the foreign substance collecting unit 122 is less likely to scatter from the foreign substance collecting unit 122. In the case where the foreign substance attachment/detachment unit is the objective lens 107, since a large amount of foreign substance is attached to the lower end portion 107a of the objective lens 107, it is possible to improve the collection rate of foreign substance by the foreign substance collecting unit 122 by the structure of FIG. 6B.

Fourth Embodiment

The first embodiment has described whose upper end portion is attached with the foreign substance collecting unit 122 in which the lid 201 provided with the hole 202 through which the foreign substance passes at the center. The present embodiment will describe providing a slit in the internal space of the foreign substance collecting unit 122. Matters described in the first embodiment and not described in the present embodiment can also be applied to the present embodiment unless under special circumstances.

Figure 7:
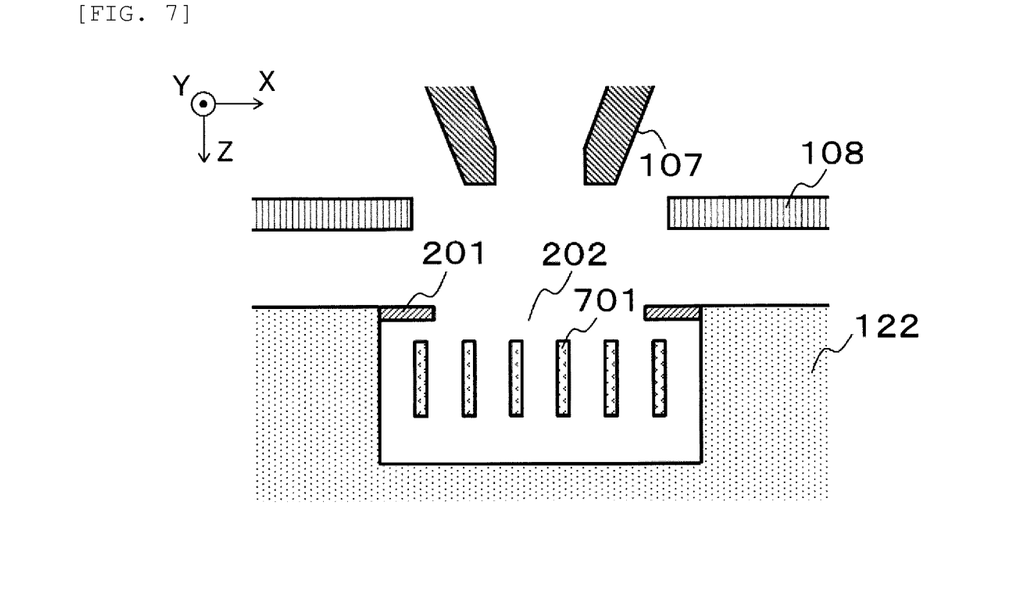
FIG. 7 is a diagram showing a foreign substance collecting unit according to a fourth embodiment.

The foreign substance collecting unit 122 according to the present embodiment will be described with reference to FIG. 7. FIG. 7 is a cross-sectional view of the foreign substance collecting unit 122 disposed below the objective lens 107. As shown in FIG. 7, in the foreign substance collecting unit 122 of the present embodiment, the lid 201 having the hole 202 in the center is attached to the upper end portion, and a slit 701 having gaps extending in a dropping direction of the foreign substance is provided in the internal space. The gaps of the slit 701 have such a size that a foreign substance can pass therethrough.

In the foreign substance collecting unit 122 of the present embodiment, the foreign substance which is detached from the foreign substance attachment/detachment unit and dropped down and passes through the gap of the slit 701 is rebounded by the bottom surface of the foreign substance collecting unit 122, and then repeatedly collides with the slit 701. Since the foreign substance repeatedly colliding with the slit 701 is eventually decelerated, the foreign substance remains in the internal space of the foreign substance collecting unit 122 without being scattered. That is, also in the present embodiment, similarly to the first embodiment, it is possible to provide the charged particle beam device capable of reducing the scattering of the collected foreign substance.

The slit 701 may be a conductive member and may be configured to be capable of applying a voltage. By applying a voltage to the slit 701, it is possible to form an electric field that can improve the collection rate of foreign substance by the foreign substance collecting unit 122.

Fifth Embodiment

The first embodiment has described the foreign substance collecting unit 122 whose upper end portion is attached with the lid 201 provided with the hole 202 through which the foreign substance passes at the center. The present embodiment will describe providing an electrode for controlling an electric field formed between the foreign substance collecting unit 122 and the foreign substance attachment/detachment unit. Matters described in the first embodiment and not described in the present embodiment can also be applied to the present embodiment unless under special circumstances.

Figure 8:
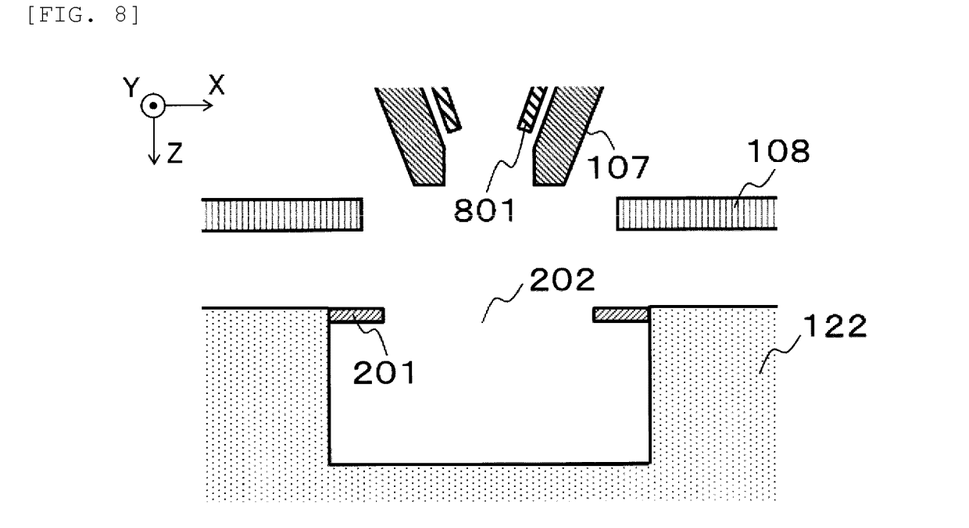
FIG. 8 is a diagram showing the foreign substance collecting unit according to a fifth embodiment.

The foreign substance collecting unit 122 according to the present embodiment will be described with reference to FIG.

8. FIG. 8 is a cross-sectional view of the foreign substance collecting unit 122 disposed below the objective lens 107. As shown in FIG. 8, in the foreign substance collecting unit 122 of the present embodiment, a lid 201 having a hole 202 in the center is attached to the upper end portion, and an electric field control electrode 801 is provided. The electric field control electrode 801 is an electrode applied with a voltage for controlling the intensity of an electric field formed between the foreign substance collecting unit 122 and the objective lens 107. That is, by controlling the voltage applied to the electric field control electrode 801, the intensity of the electric field between the foreign substance collecting unit 122 and the objective lens 107 is further increased, the foreign substance is easily detached from the foreign substance attachment/detachment unit, and the collection rate of the foreign substance by the foreign substance collecting unit 122 is improved.

In the present embodiment, by controlling the voltage applied to the electric field control electrode 801, the electric field between the foreign substance collecting unit 122 and the objective lens 107 can be set to an appropriate intensity. Thereby the detachment of the foreign substance from the foreign substance attachment/detachment unit and the collection of the foreign substance by the foreign substance collecting unit 122 are facilitated. That is, it is possible to provide a charged particle beam device capable of reducing scattering of a collected foreign substance.

The electric field control electrode 801 is preferably provided inside the objective lens 107. By providing the electric field control electrode 801 inside the objective lens 107, since the intensity of the electric field in the vicinity of the objective lens 107 can be easily controlled, the foreign substance can be easily detached from the objective lens 107. The electric field control electrode 801 may be used as a foreign substance attachment/detachment unit.

Sixth Embodiment

The first embodiment has described the foreign substance collecting unit 122 whose upper end portion is attached with the lid 201 provided with the hole 202 through which the foreign substance passes at the center. The present embodiment describes providing an inclined surface on the bottom surface of the foreign substance collecting unit 122. Matters described in the first embodiment and not described in the present embodiment can also be applied to the present embodiment unless under special circumstances.

Figure 9A:
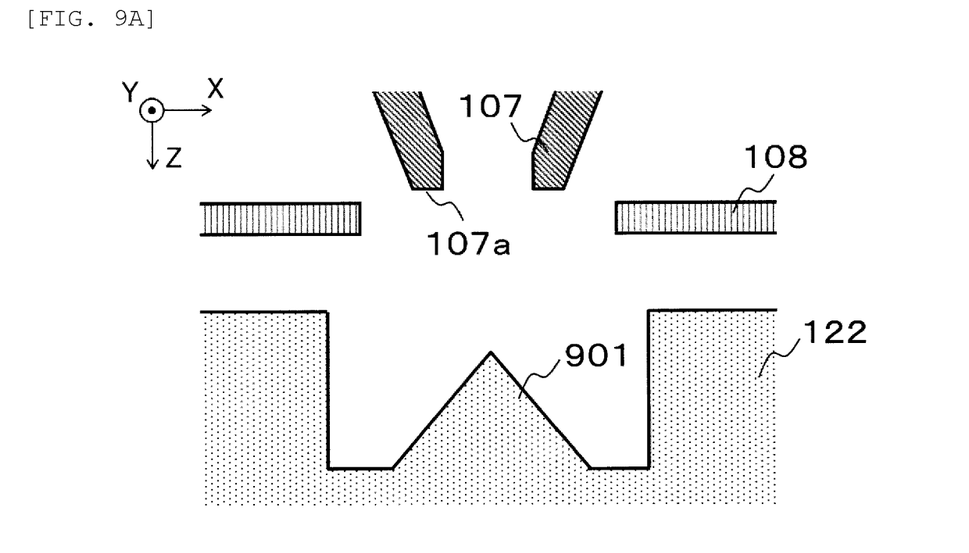
FIG. 9A is a diagram showing the foreign substance collecting unit according to a sixth embodiment.

The foreign substance collecting unit 122 according to the present embodiment will be described with reference to FIG. 9A. FIG. 9A is a cross-sectional view of the foreign substance collecting unit 122 disposed below the objective lens 107 that functions as a foreign substance attachment/detachment unit. As shown in FIG. 9A, the bottom surface of the foreign substance collecting unit 122 of the present embodiment has an inclined surface. In the case where the foreign substance attachment/detachment unit is the objective lens 107, it is preferable that a portion immediately below the lower end portion 107a of the objective lens 107, which is attached with more foreign substance, is an inclined surface.

Since the bottom surface has the inclined surface, the foreign substance dropped from the objective lens 107 and colliding with the bottom surface of the foreign substance collecting unit 122 rebounds toward the side surface of the foreign substance collecting unit 122, and repeatedly collides with the bottom surface and the side surface. Since the foreign substance repeatedly colliding with the inner wall surface of the foreign substance collecting unit 122 is eventually decelerated, the foreign substance remains in the internal space of the foreign substance collecting unit 122 without being scattered. That is, also in the present embodiment, similarly to the first embodiment, it is possible to provide the charged particle beam device capable of reducing the scattering of the collected foreign substance.

Figure 9B:
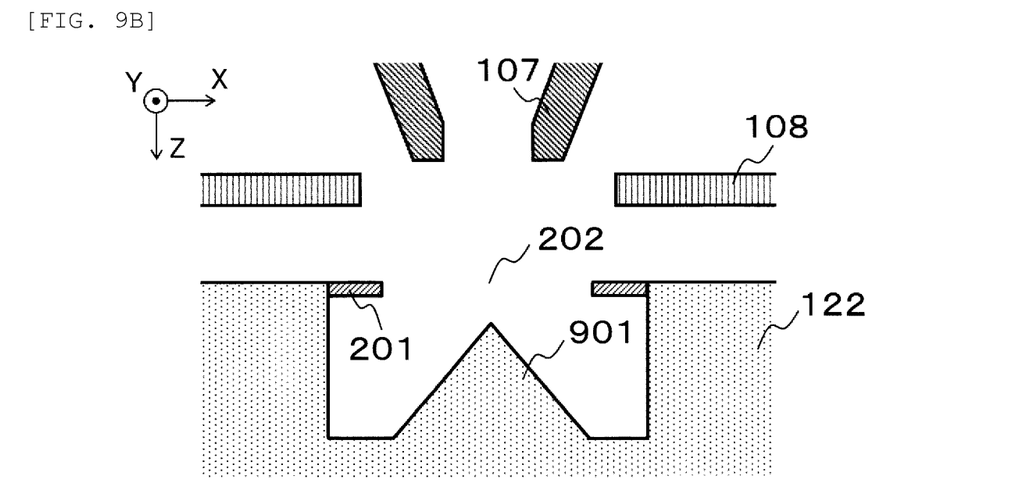
FIG. 9B is a diagram showing a modification of the foreign substance collecting unit according to the sixth embodiment.

As shown in FIG. 9B, the lid 201 having the hole 202 at the center may not be attached to the upper end portion of the foreign substance collecting unit 122 of the present embodiment. When the lid 201 is attached to the upper end portion of the foreign substance collecting unit 122, it is preferable that the portion of the lid 201 directly below the hole 202 is an inclined surface.

In the foreign substance collecting unit 122 of the present embodiment, the foreign substance which is detached from the foreign substance attachment/detachment unit and dropped is rebounded by the inclined surface of the bottom surface of the foreign substance collecting unit 122, and then repeatedly collides with the side surface and the bottom surface of the foreign substance collecting unit 122 and the lower surface of the lid 201. Since the foreign substance repeatedly colliding with the inner wall surface and the lid 201 of the foreign substance collecting unit 122 is eventually decelerated, the foreign substance remains in the internal space of the foreign substance collecting unit 122 without being scattered. That is, also in the present embodiment, similarly to the first embodiment, it is possible to provide the charged particle beam device capable of reducing the scattering of the collected foreign substance.

Seventh Embodiment

In the first embodiment, the foreign substance collecting unit 122 in which the lid 201 provided with the hole 202 through which the foreign substance passes at the center is attached to the upper end portion has been described. In the present embodiment, the adhesive force of at least a part of the inner wall surface of the foreign substance collecting unit 122 is made larger than that of the other part. Matters described in the first embodiment and not described in the present embodiment can also be applied to the present embodiment unless under special circumstances.

Figure 10A:
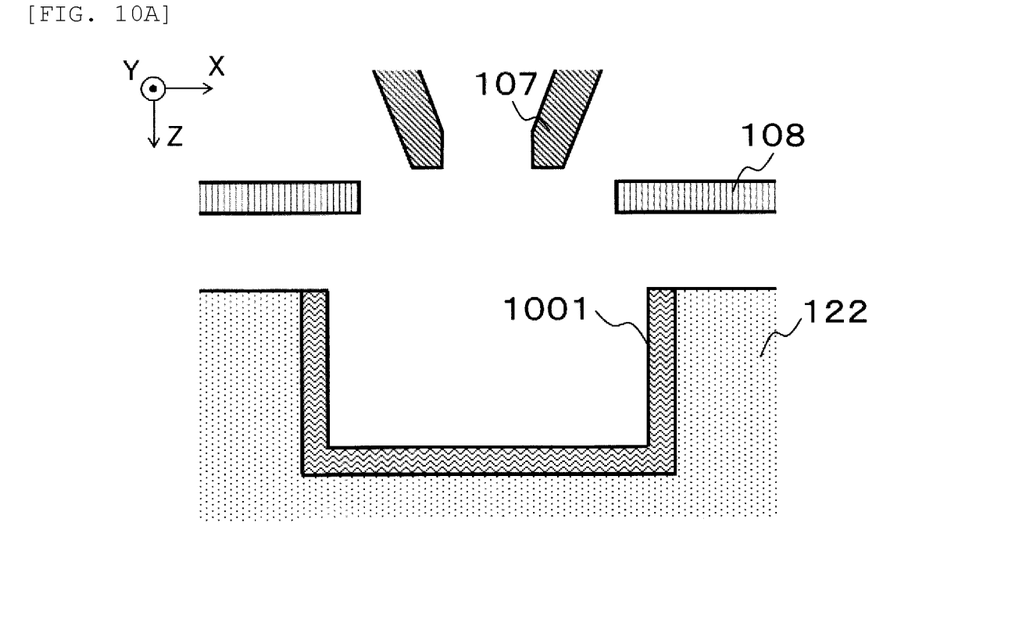
FIG. 10A is a diagram showing the foreign substance collecting unit according to a seventh embodiment.

The foreign substance collecting unit 122 according to the present embodiment will be described with reference to FIG. 10A. FIG. 10A is a cross-sectional view of the foreign substance collecting unit 122 disposed below the objective lens 107 that functions as a foreign substance attachment/detachment unit. As shown in FIG. 10A, the foreign substance collecting unit 122 of the present embodiment is a surface 1001 whose inner wall surface is a mirror surface. A surface roughness of the mirror surface 1001 is, for example, 1 nm or less in terms of an arithmetic average roughness Ra value. The inner wall surface, which is the mirror surface 1001, has a large effective contact area with a foreign substance having a particle diameter of several nm to several tens of μm, and the adhesive force due to van der Waals force or the like increases by 2 to 10 times. That is, in the foreign substance collecting unit 122 of the present embodiment, since the adhesive force of the foreign substance in contact with the inner wall surface of the foreign substance collecting unit 122 is increased, scattering from the foreign substance collecting unit 122 can be reduced.

Figure 10B:
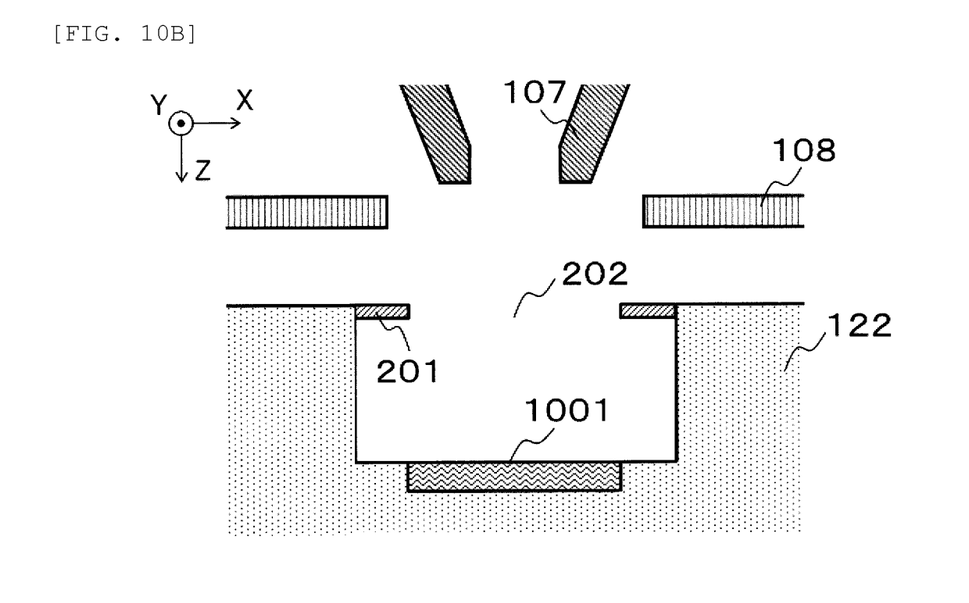
FIG. 10B is a diagram showing a modification of the foreign substance collecting unit according to the seventh embodiment.

As shown in FIG. 10B, the lid 201 having the hole 202 at the center may not be attached to the upper end portion of the foreign substance collecting unit 122 of the present embodiment. In the case where the lid 201 is attached to the upper end portion of the foreign substance collecting unit 122, it is preferable that at least a portion of the surface 1001 directly below the hole of the lid 201 through which the foreign substance dropped from the foreign substance attachment/detachment unit such as the objective lens 107 passes is a mirror.

Increasing the adhesive force of the inner wall surface of the foreign substance collecting unit 122 is not limited to the surface 1001 which is a mirror surface. For example, a part of the inner wall surface of the foreign substance collecting unit 122, in particular, a part directly below the hole of the lid 201 may be made of a material different from other surfaces, for example, a material having rigidity lower than that of the foreign substance and more easily deformable. In a portion made of a material that has lower rigidity and is more easily deformable than the foreign substance, an effective surface area with respect to the foreign substance increases, and thus an adhesive force of the foreign substance increases. A part of the inner wall surface of the foreign substance collecting unit 122 may be made of a material to which water molecules are easily adsorbed according to the degree of vacuum or the temperature in the foreign substance collecting unit 122. The adhesive force due to liquid cross-linking force increases at a portion where the material is easy to adsorb water molecules. A part of the inner wall surface of the foreign substance collecting unit 122 may be made of a material that is linear molecules and has a larger molecular weight. In a portion where the material is linear molecules and has a larger molecular weight, the adhesive force due to the van der Waals force increases.

As described above, in the present embodiment, since the adhesive force of at least a part of the inner wall surface of the foreign substance collecting unit 122 to the foreign substance is increased, the scattering of the foreign substance from the foreign substance collecting unit 122 can be reduced. By limiting the portions made of different materials to a part of the inner wall surface of the foreign substance collecting unit 122, it is possible to reduce the material cost and the processing cost.

As described above, a plurality of embodiments of the charged particle beam device of the invention has been described. The invention is not limited to the embodiments, and can be embodied by modifying elements without departing from a spirit of the invention. In addition, a plurality of elements disclosed in the embodiments may be appropriately combined. Further, some elements may be deleted from all the elements shown in the embodiments.

REFERENCE SIGN LIST

- 101 electron gun
- 102 first condenser lens
- 103 aperture
- 104 second condenser lens
- 105 detector
- 106 scanning deflector
- 107 objective lens
- 107a lower end portion
- 108 shield electrode
- 109 sample stage
- 110 housing
- 111 control unit
- 112 input/output unit
- 113 storage unit
- 122 foreign substance collecting unit
- 201 lid
- 202 hole
- 401 side surface
- 501 mesh electrode
- 502 equipotential surface
- 701 slit
- 801 electric field control electrode
- 901 inclined surface
- 1001 mirror surface

The invention claimed is:

1. A charged particle beam device, comprising:
   a sample chamber in which a sample is to be disposed; and
   a charged particle beam source configured to irradiate the sample with a charged particle beam, the charged particle beam device further comprising:
   a foreign substance attachment/detachment unit from or to which a foreign substance is to detach or attach; and
   a foreign substance collecting unit provided in the sample chamber and configured to collect a foreign substance dropped from the foreign substance attachment/detachment unit, wherein
   an opening through which the foreign substance passes is provided in an upper end portion of the foreign substance collecting unit, and
   an area of the opening is smaller than a horizontal cross-sectional area of an internal space of the foreign substance collecting unit.

2. The charged particle beam device according to claim 1, wherein
   the opening is a hole provided in a center of a lid attached to the upper end portion.

3. The charged particle beam device according to claim 2, wherein
   a mesh electrode is provided in the hole.

4. The charged particle beam device according to claim 2, wherein
   a bottom surface facing the hole has an inclined surface facing a side surface of the foreign substance collecting unit.

5. The charged particle beam device according to claim 2, wherein
   the foreign substance attachment/detachment unit is an objective lens configured to focus the charged particle beam, and
   a size of the hole is larger than a lower end portion of the objective lens.

6. The charged particle beam device according to claim 1, wherein
   the foreign substance collecting unit has a side surface inclined toward a bottom surface side.

7. The charged particle beam device according to claim 1, wherein
   the opening is a gap of a mesh electrode attached to the upper end portion.

8. The charged particle beam device according to claim 7, wherein
   the gap of the mesh electrode is larger in a central portion than in a peripheral portion of the foreign substance collecting unit.

9. The charged particle beam device according to claim 1, wherein
   the foreign substance collecting unit is provided with a slit in an internal space thereof, the slit having a gap extending in a dropping direction of the foreign substance.

10. The charged particle beam device according to claim 1, wherein at least a part of an inner wall surface of the foreign substance collecting unit is a mirror surface or a surface of a material different from that of the foreign substance collecting unit.

11. The charged particle beam device according to claim 1, wherein
the foreign substance attachment/detachment unit is an objective lens configured to focus the charged particle beam, and
the foreign substance collecting unit is configured to be applied with a voltage for detaching the foreign substance from the objective lens.

12. The charged particle beam device according to claim 11, further comprising:
an electric field control electrode that is an electrode configured to be applied with a voltage for further increasing an intensity of an electric field between the foreign substance collecting unit and the objective lens.

13. The charged particle beam device according to claim 12, wherein
the electric field control electrode is provided inside the objective lens.

14. A charged particle beam device, comprising:
a sample chamber in which a sample is to be disposed; and
a charged particle beam source configured to irradiate the sample with a charged particle beam, the charged particle beam device further comprising:
a foreign substance attachment/detachment unit from or to which a foreign substance is to detach or attach; and
a foreign substance collecting unit provided in the sample chamber and configured to collect a foreign substance dropped from the foreign substance attachment/detachment unit, wherein
a bottom surface of the foreign substance collecting unit has an inclined surface.

15. A charged particle beam device, comprising:
a sample chamber in which a sample is to be disposed; and
a charged particle beam source configured to irradiate the sample with a charged particle beam, the charged particle beam device further comprising:
a foreign substance attachment/detachment unit from or to which a foreign substance is to detach or attach; and
a foreign substance collecting unit provided in the sample chamber and configured to collect a foreign substance dropped from the foreign substance attachment/detachment unit, wherein
at least a part of an inner wall surface of the foreign substance collecting unit is a mirror surface or a surface of a material different from that of the foreign substance collecting unit.

* * * * *